United States Patent [19]

Minami et al.

[11] 3,969,637

[45] July 13, 1976

[54] TRANSISTOR CIRCUIT

[75] Inventors: Norio Minami, Katsuta; Mitsuya Sato, Kokubunji, both of Japan

[73] Assignee: Hitachi, Ltd., Japan

[22] Filed: June 25, 1975

[21] Appl. No.: 590,377

Related U.S. Application Data

[63] Continuation of Ser. No. 432,326, Jan. 10, 1974, abandoned.

[30] Foreign Application Priority Data

Jan. 10, 1973  Japan.................................. 48-5244

[52] U.S. Cl................................ 307/237; 307/254; 307/296

[51] Int. Cl.² .......................................... H43K 17/00

[58] Field of Search ........... 307/237, 254, 255, 296, 307/297; 330/22, 76; 179/15 AN

[56] References Cited

UNITED STATES PATENTS

| | | | |
|---|---|---|---|
| 3,168,706 | 2/1965 | Brenig................................... | 330/22 |
| 3,189,752 | 6/1965 | Anothy................................ | 307/216 |
| 3,259,760 | 7/1966 | Morey et al. ....................... | 328/151 |
| 3,573,646 | 6/1971 | DeWit................................... | 330/22 |
| 3,649,769 | 3/1972 | Pest..................................... | 307/255 |

*Primary Examiner*—Stanley D. Miller, Jr.
*Assistant Examiner*—B. P. Davis
*Attorney, Agent, or Firm*—Craig & Antonelli

[57] ABSTRACT

A transistor circuit comprises a cancellation circuit which receives, as an input signal, an output signal of a signal circuit having at least a connection wiring and which supplies to the connection wiring a cancellation current opposite in phase and substantially equal in magnitude to a signal current supplied to the connection wiring by the signal circuit, whereby a signal voltage due to the signal current and the distributed resistance of the connection wiring is prevented from being produced.

3 Claims, 2 Drawing Figures

TRANSISTOR CIRCUIT

This is a continuation of application Ser. No. 432,326, filed Jan. 10, 1974 now abandoned.

BACKGROUND OF THE INVENTION

1. Field of the Invention

The present invention relates to a transistor circuit, and is mainly directed to a high gain circuit constructed of a monolithic IC (semiconductor integrated circuit).

2. Description of the Prior Art

In a monolithic IC, power supply wirings, grounding wirings, bias wirings and other connection wirings are principally formed of evaporated wirings of aluminum or the like. These wirings have a fine cross section, and their distributed resistances have considerably values. Accordingly, where a circuit in which a large signal current flows through a power supply wiring and a grounding wiring is put into the form of a monolithic IC, signal voltages are generated in the power supply wiring and the grounding wiring by the large signal current and the considerable distributed resistances of the power supply wiring and the grounding wiring. The signals may leak into a circuit at the preceding stage and other circuits which are interconnected by the wirings. As a result, the signal is distorted, and in some cases, oscillation occurs.

In order to solve the above problem, measures for preventing signal power sources from being generated in power source wirings, grounding wirings etc., and the signals from leaking to other circuits have hitherto been necessary during the design of the arrangement of the circuit elements, the arrangements, lead wirings, etc. within the monolithic IC. For this reason, design of the monolithic IC has required an enormous amount of time and labor.

SUMMARY OF THE INVENTION

The present invention has been developed in order to solve the problem stated above and has as its object, the provision of a circuit in which no signal voltage is generated in the distributed resistances of power source wirings, grounding wirings, bias wirings, etc.

The fundamental construction of the present invention for accomplishing the object is characterized by a cancellation circuit which receives, as an input signal, an output signal of a signal circuit having at least a connection wiring and which supplies to the connection wiring a cancellation current opposite in phase and substantially equal in magnitude to a signal current supplied to the connection wiring by the signal circuit.

PREFERRED EMBODIMENT OF THE INVENTION

Figure 1:
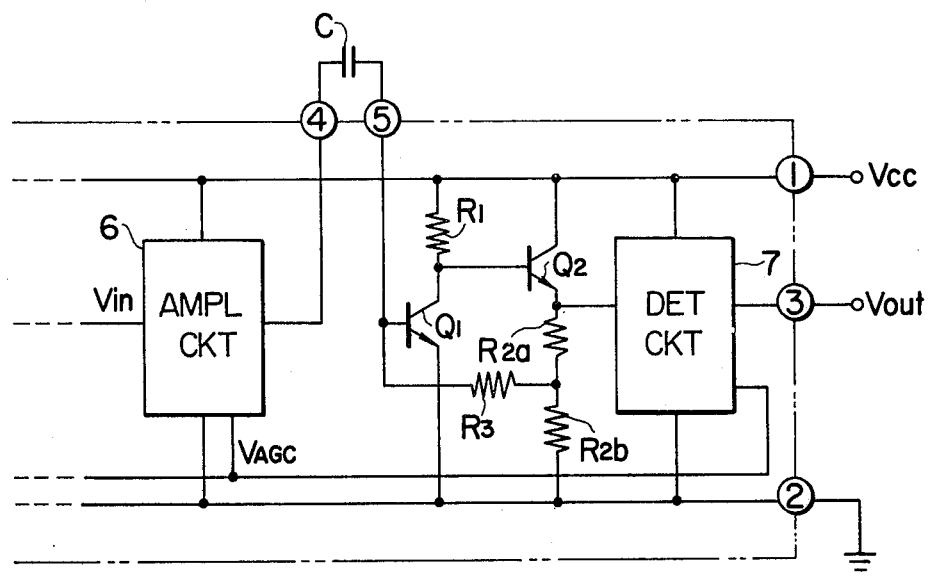
FIG. 1 is a circuit diagram of a semiconductor integrated circuit for the RF - IF stage of an AM radio receiver, showing an embodiment of the present invention.

FIG. 1 shows an embodiment of the invention applied to the second stage intermediate-frequency amplifier circuit of a semiconductor integrated circuit for RF - IF conversion in an AM radio receiver.

As is shown in the figure, the amplifier circuit according to the present invention is composed of a signal transistor $Q_1$ which has a collector load resistance $R_1$, and a cancellation transistor $Q_2$ which receives, as an input, the output of the signal circuit and which has emitter load resistances $R_{2a}$ and $R_{2b}$ in order to cause current flow, the current being opposite in phase to current flowing through the transistor $Q_1$. The emitter load resistances $R_{2a}$ and $R_{2b}$ are selected to have such values that the currents flowing through the transistors $Q_1$ and $Q_2$ become substantially equal. Resistance $R_3$ is a bias resistance for the signal transistor $Q_1$. The bias resistance $R_3$ is connected between the junction of the divided emitter load resistances $R_{2a}$, $R_{2b}$ and the base of the signal transistor $Q_1$.

In the circuit arrangement, the input signal of the signal transistor $Q_1$ is obtained through a coupling capacitor C from the first stage intermediate-frequency amplifier circuit 6. From the output of the second stage intermediate-frequency amplifier circuit, a voice output $V_{out}$ and an automatic gain control Voltage $V_{AGC}$ are derived by a detector circuit 7. The portion surrounded by broken lines in the figure is an integrated circuit. An externally mounted terminal 1 is a power supply terminal, 2 a ground terminal, 3 an output terminal, and 4 and 5 coupling capacitor terminals.

Figure 2:
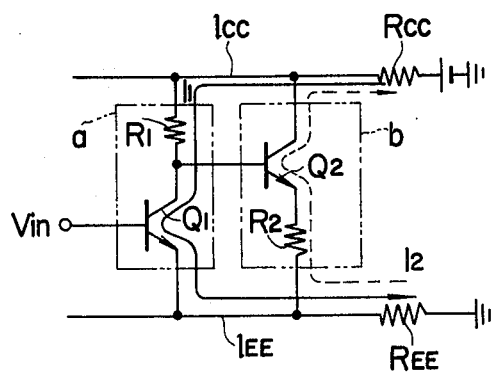
FIG. 2 is a circuit diagram for explaining the operating principle of the embodiment.

FIG. 2 is a diagram for explaining the operating principle of the amplifier circuit according to the present invention. As illustrated in the figure, when the signal circuit A causes a large signal current $I_1$, shown by a full line, to flow through a power supply wiring $l_{CC}$ and a grounding wiring $l_{EE}$, the cancellation circuit b causes a cancellation current $I_2$, shown by a broken line and opposite in phase and substantially equal in magnitude to the signal current $I_1$, to flow through the power supply wiring $l_{CC}$ and the grounding wiring $l_{EE}$. Consequently, no signal voltage is generated in the distributed resistance $R_{CC}$ of the power supply wiring and the distributed resistance $R_{EE}$ of the grounding wiring, and crosstalk of the signal or oscillation can be prevented. This simplifies the design and development of monolithic ICs.

In addition to the foregoing embodiment, the present invention can have the following aspects.

The bias circuit of the signal transistor shown in FIG. 1 is not restricted to that led from the point of the division of the emitter load resistances. The output terminal may also be led from the collector of the signal transistor $Q_1$. Further, the cancellation circuit may be any circuit other than the emitter follower circuit shown in the embodiment, insofar as it produces a current opposite in phase and substantially equal in magnitude to that of the signal circuit.

The present invention is applicable, not only to the cancellation of a signal voltage under crosstalk to the grounding wiring and the power supply wiring, but also to the case of cancelling a signal voltage under crosstalk to a bias wiring for biasing a plurality of networks by a common bias circuit. Moreover, it is applicable, not only to a monolithic IC, but also to a circuit whose distributed resistances of grounding wirings, power supply wirings etc., are high, for example, a signal relay circuit. Moreover, it is also applicable to the case of employing a power circuit which has a high internal impedance.

What we claim:

1. A circuit comprising:
   a first and a second conductor means each having substantially no resistance;

a grounding conductor means having a substantial parasitic resistance for connecting said first conductor means to ground;

a power supplying conductor means having a substantial parasitic resistance for connecting said second conductor means to a power source;

a first signal amplifier circuit means having an input terminal and an output terminal, coupled between said first and second conductor means, for amplifying a signal supplied to the input terminal and deriving the amplified signal from the output terminal; and a succeeding circuit means, coupled to said output terminal of the first signal amplifier circuit means, for preventing a signal voltage due to said parasitic resistances and said amplified signal of the first signal amplifier circuit means from leaking to said input terminal of the first signal amplifier circuit means, said succeeding circuit means including a second signal amplifier circuit means, connected between said first and second conductor means, for amplifying said amplified signal of the first signal amplifier circuit means into a signal current of a prescribed magnitude, and a cancellation circuit means, connected between said first and second conductor means, and responsive to the output of said second signal amplifier circuit means, for supplying to said grounding and power supplying conductor means a cancellation current which is substantially equal in magnitude and opposite in phase to said signal current amplified by said second signal amplifier circuit means.

2. A circuit comprising:

a first and a second conductor means each having substantially no resistance;

a grounding conductor means having a substantial parasitic resistance for connecting said first conductor means to ground;

a power supplying conductor means having a substantial parasitic resistance for connecting said second conductor means to a power source;

a signal amplifier circuit means having an input terminal and an output terminal, coupled between said first and second conductor means, for amplifying a signal supplied to the input terminal and deriving an amplified signal from the output terminal; and a succeeding circuit means, coupled to said output terminal of the signal amplifier circuit means, for preventing a signal voltage due to said parasitic resistances and said amplified signal of the signal amplifier circuit means to be prevented from leaking to said input terminal of the signal amplifier circuit means, said succeeding circuit means including a first amplifier means having an input terminal and a pair of output terminals, one of said output terminals of the first amplifier means being connected to said first conductor means, said input terminal of the first amplifier means being connected to the output terminal of the signal amplifier circuit means, a first resistance means connected between the other of said pair of output terminals of said first amplifier means and said second connecting conductor means, a second amplifier means having an input terminal and a pair of output terminals, one of said pair of output terminals of the second amplifier means being connected to said second connecting conductor means, said input terminal of the second amplifier means being connected to said other output terminal of said first amplifier means, and a second resistance means, connected between the other output terminal of said second amplifier means and said first connecting conductor means, for making a signal current flowing between the output terminals of the second amplifier means substantially equal in magnitude and opposite in phase to a signal current flowing between the output terminals of the first amplifier means.

3. A circuit comprising:

a first and a second conductor means each having substantially zero resistance;

a third conductor means having substantial parasitic resistance for connecting said first conductor means to a first voltage source;

a fourth conductor means having substantial parasitic resistance for connecting said second conductor means to a second voltage source;

a signal amplifier circuit means having an input terminal and an output terminal, coupled between said first and second conductor means, for amplifying a signal supplied to the input terminal and deriving the amplified signal from the output terminal; and a succeeding circuit means, coupled to said output terminal of the signal amplifier circuit means, for preventing a signal voltage due to said parasitic resistances and said amplified signal of the signal amplifier circuit means from leaking to said input terminal of the signal amplifier circuit means, and succeeding circuit means including a first transistor having an emitter, a base and a collector, said emitter being connected to said second conductor means, said base being connected to said output terminal of said signal amplifier circuit means, a first resistance means for connecting said collector to said first conductor means, a second transistor having an emitter, a base and a collector, the collector of the second transistor being connected to said first conductor means, the base of the second transistor being connected to the collector of the first transistor, and a second resistance means, connected between the emitter of the second transistor and said second conductor means, for making a signal current flowing between the collector and emitter of said second transistor substantially equal in magnitude and opposite in phase to a signal current flowing between the collector and emitter of the first transistor. .

* * * * *